United States Patent [19]

Wegeng et al.

[11] Patent Number: 5,611,214
[45] Date of Patent: Mar. 18, 1997

[54] MICROCOMPONENT SHEET ARCHITECTURE

[75] Inventors: Robert S. Wegeng; M. Kevin Drost; Carolyn E. McDonald, all of Richland, Wash.

[73] Assignee: Battelle Memorial Institute, Richland, Wash.

[21] Appl. No.: 282,663

[22] Filed: Jul. 29, 1994

[51] Int. Cl.[6] ............................. F25B 1/00; F28F 7/00
[52] U.S. Cl. ..................... 62/498; 62/51.1; 165/185; 361/700
[58] Field of Search ..................... 165/185; 361/700; 62/498, 115, 51, 1 R

[56] References Cited

U.S. PATENT DOCUMENTS

| | | | |
|---|---|---|---|
| 4,386,505 | 6/1983 | Little | 165/185 X |
| 4,392,362 | 7/1983 | Little | 165/185 X |

OTHER PUBLICATIONS

High Flux Boiling in Low Rate, Low Pressure Drop Mini-Channel Heat Sinks Bowers et al Mar. 11, 1993, Purdue University.

Primary Examiner—William E. Wayner
Attorney, Agent, or Firm—Paul W. Zimmerman

[57] ABSTRACT

The invention is a microcomponent sheet architecture wherein macroscale unit processes are performed by microscale components. The sheet architecture may be a single laminate with a plurality of separate microcomponent sections or the sheet architecture may be a plurality of laminates with one or more microcomponent sections on each laminate. Each microcomponent or plurality of like microcomponents perform at least one unit operation. A first laminate having a plurality of like first microcomponents is combined with at least a second laminate having a plurality of like second microcomponents thereby combining at least two unit operations to achieve a system operation.

15 Claims, 8 Drawing Sheets

MICROCOMPONENT SHEET ARCHITECTURE

This invention was made with Government support under Contract DE-AC06-76RLO 1830 awarded by the U.S. Department of Energy. The Government has certain rights in the invention.

FIELD OF THE INVENTION

The present invention relates generally to an apparatus and method for accomplishing heat transfer and/or power conversion, or chemical conversions and separations. More specifically, the invention is a microcomponent sheet architecture wherein macroscale production is achieved with a plurality of microscale elements operating in parallel.

BACKGROUND OF THE INVENTION

In order to continually improve physical standards of living for greater numbers of people, it is necessary to achieve more results with fewer resources. From the industrial revolution through the present, economies of scale have resulted in very large components and systems of capital equipment and central operating facilities. Central facilities have the further disadvantage of requiring distribution systems which have their own capital costs and efficiency losses. Nevertheless, historically, central systems have exhibited cost advantages that supported their use. Smaller distributed components and systems are made having higher unit costs and used in applications where the substantial capital cost of a larger, more efficient component or system is not justified. Thus, there is a need for components and systems that can be made of a size appropriate for the desired capacity and can avoid the need for a distribution system yet achieve the efficiency of the larger scale components and systems.

Components exhibiting high efficiency at small scale include microchannel heat exchangers used to remove heat from electronic components.

U.S. Pat. No. 5,115,858, May 26, 1992, MICRO-CHANNEL WAFER COOLING CHUCK, Fitch et al. discusses a 3M microchannel stock used to cool a wafer by passing a liquid coolant through alternate channels. A high heat transfer fluid is passed through the remaining channels to remove the heat.

U.S. Pat. No. 4,998,580, Mar. 12, 1991, CONDENSER WITH SMALL HYDRAULIC DIAMETER FLOW PATH, Guntly et al. shows a condenser for use in air conditioning or refrigeration systems. Construction of the condenser is corrugated metal and flat strips.

U.S. Pat. No. 5,016,707, May 21, 1991, MULTI-PASS CROSSFLOW JET IMPINGEMENT HEAT EXCHANGER, Nguen describes a crossflow heat exchanger and a construction thereof by stacking multiple core and spacer plates.

U.S. Pat. No. 5,296,775, Mar. 22, 1994, COOLING MICROFAN ARRANGEMENTS AND PROCESS, Cronin et al. discusses a micro electronic cooling fan in combination with ridges or fins, e.g., open channels.

The art as shown in the above referenced patents teaches design of specific heat exchange equipment requiring substantial fabrication for individual pieces of heat exchange equipment. Use of this equipment for medium to large scale operations would require the fabrication of multiple heat exchangers wherein the cost increases linearly with the number of heat exchangers.

Moreover, fabrication of a system is considered complicated and expensive on a microscale. Although it is presently possible to make microscale motors, for example, conventional wisdom combines microscale components in series with the result that achieving a macroscale result would require enormous effort and cost of making millions of tiny systems.

Thus, there is a need for a heat exchanger, as well as other system components, and a fabrication technique that permits fabrication of a necessary number of heat exchangers and other components for an application wherein the unit cost per component is sufficiently low that extension to multiple components is achieved with much less cost, and wherein combination of components to form systems for macroscale results is also achieved with low cost.

SUMMARY OF THE INVENTION

The invention is a microcomponent sheet architecture for example, laminate having microchannels. The sheet architecture may be a single laminate with a plurality of separate microcomponent sections or the sheet architecture may be a plurality of laminates with one or more microcomponent sections on each laminate. The microcomponents include passive microcomponents, for example micro flow paths, and active components including but not limited to micropumps and microcompressors.

Each microcomponent or plurality of like microcomponents perform at least one unit operation. A first laminate having a plurality of like first microcomponents is combined with at least a second laminate having a plurality of like second microcomponents thereby combining at least two unit operations to achieve a system operation. For, example, a laminate containing a plurality of microchannel evaporators is combined with an insulating laminate and a laminate containing a plurality of microchannel condensers, and connected to a compressor and expansion valve to obtain a macroscale heat pump.

It is an object of the present invention to provide a laminate that is useful for condensers, heat exchangers, and other components of heat transfer and/or power systems, or chemical process systems.

It is a further object of the present invention to provide a laminate wherein the cost of fabrication is substantially independent of the number of microcomponents formed thereon.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DESCRIPTION OF THE PREFERRED EMBODIMENT(S)

The invention is a microcomponent sheet or laminate architecture of individual laminates wherein the fundamental structure is a laminate or laminate portion having tens to millions of microcomponents, preferably hundreds to millions, thereby enabling a laminate to provide macroscale unit operation, for example a condenser having a capacity in the $kW_{th}$ range, and the laminates connected, thereby combining unit operations, to form an assembly, or system, for example a heat pump.

FUNDAMENTAL STRUCTURE

Figure 1:
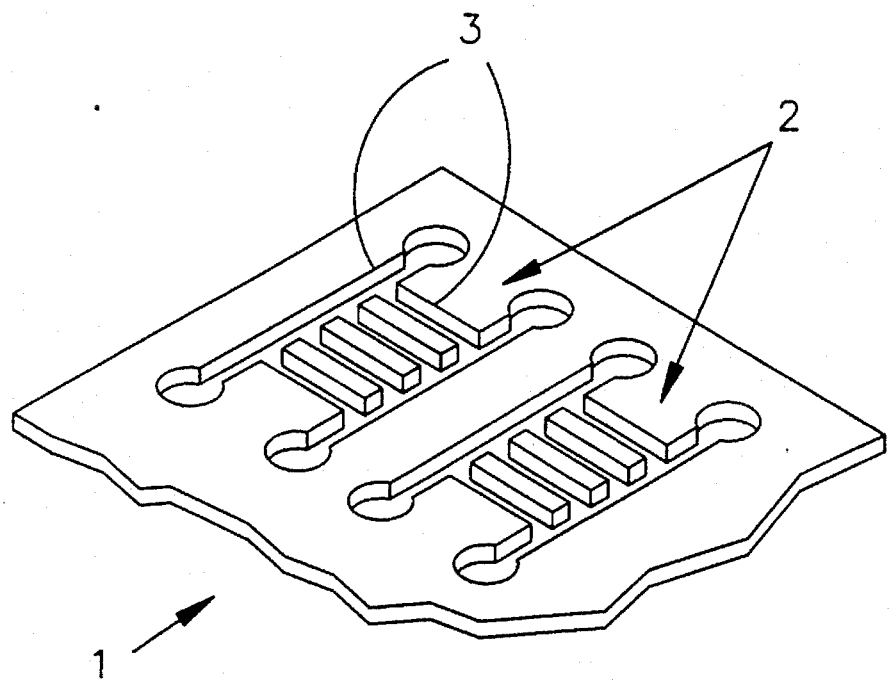
FIG. 1 is an exploded view of a portion of a microscale component laminate with laterally closed lands.

FIG. 1 shows the fundamental structure of a laminate. On a material sheet or laminate 1, a plurality of microcomponents 2 are embedded onto the material sheet 1. Material sheets 1 may be any solid material, but are preferably metal, ceramic, or semiconductor material. A material sheet 1 embedded with microcomponents 2 is a laminate. A laminate is also a material sheet 1 having no microcomponents or having conduits through the material sheet 1 thickness serving as a spacer or insulator.

The microcomponents 2 can be condensers, evaporators or non-phase change heat exchangers, compressors, expansion valves, or motors. It is to be understood that while the drawings and discussion thereof are limited to specific embodiments, there is practically no limit to the types and numbers of microcomponents and combinations thereof that may be included on a laminate or material sheet 1.

Although FIG. 1 depicts microcomponents 2 on one side of the material sheet 1, microcomponents may be embedded on both sides of the material sheet 1. Embedding on both sides may be particularly advantageous for dual fluid heat exchangers, for example feedwater preheating with condensed turbine exhaust.

The density of microcomponents 2 on a material sheet may range from about 1 microcomponent per square centimeter to about $10^{10}$ microcomponents per square centimeter. Within those density ranges, a range of unit lengths or unit diameters of microcomponents 2 is from about 1 micron to about 1 centimeter. The width W of the grooves or microchannels 3 may range from about 1 micron to about 1 millimeter and preferably range from about 10 microns to about 250 microns.

Figure 1A:
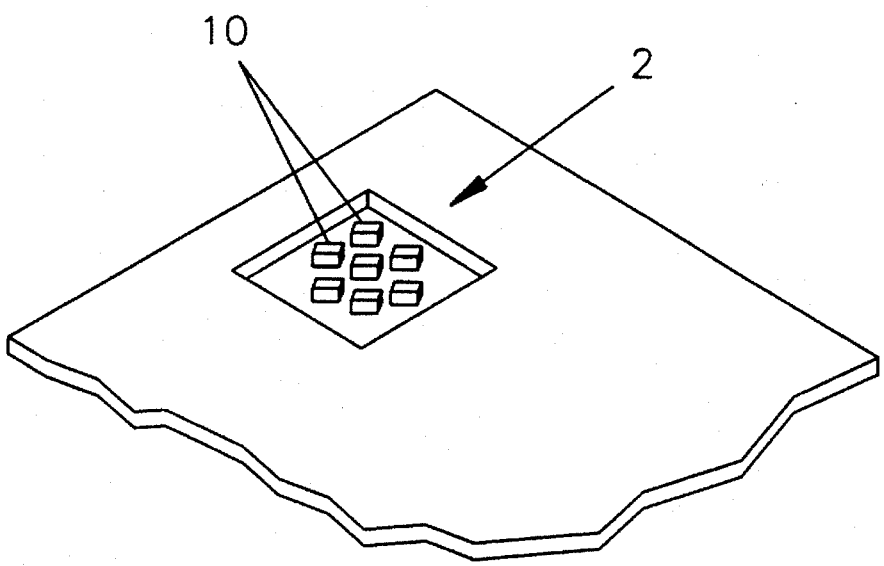
FIG. 1a is an exploded view of a portion of a microscale component laminate with laterally open lands.

The microchannels or flow paths may be laterally closed as shown in FIG. 1, or laterally open as shown in FIG 1a.

Figure 2A:
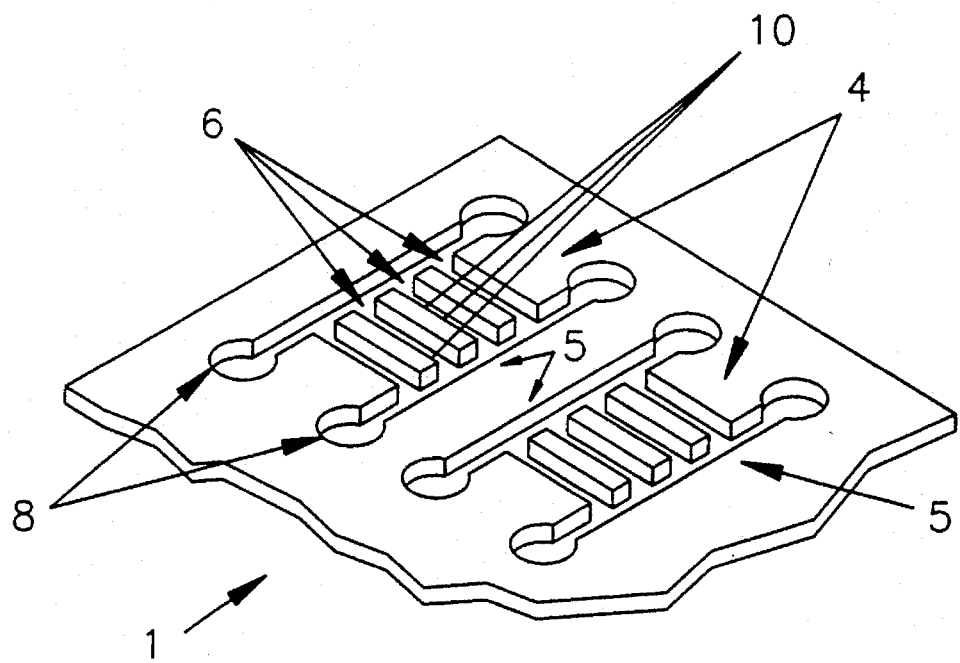
FIG. 2a is an exploded view of a portion of a microscale component laminate with connections on header ends.
Figure 2B:
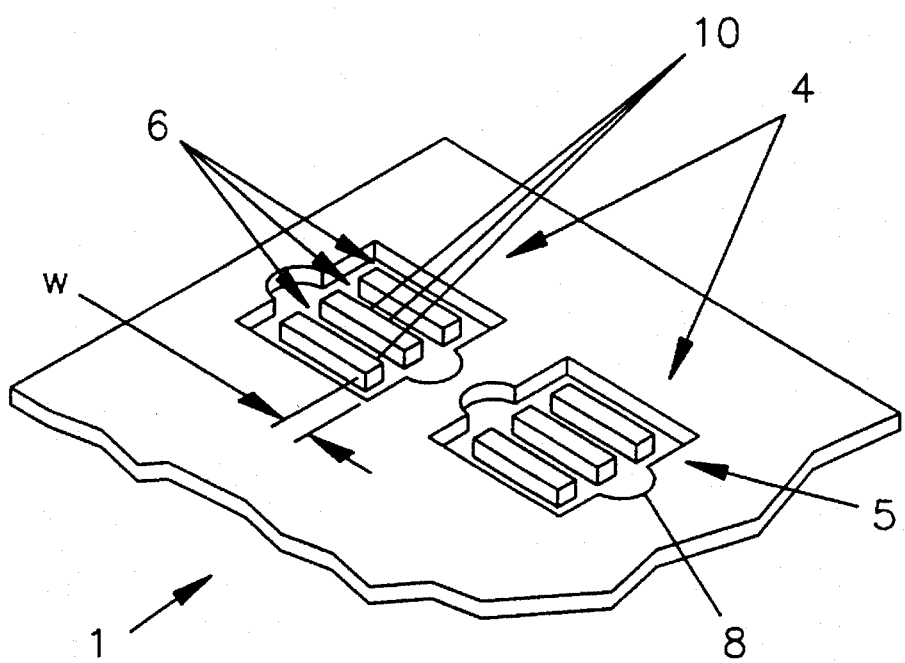
FIG. 2b is an exploded view of a portion of a microscale component laminate with connections along header length.

In FIGS. 2a and 2b, the microcomponents 2 are groove sets 4 made up of a pair of headers 5 and laterals 6. Laterals 6 are the grooves permitting flow between header pairs 5. Laterals 6 are shown substantially perpendicular to headers 5, but is will be apparent to one skilled in the art of microcomponents that a lateral 6 can form an angle other than 90 degrees with a header 5. Headers 5, may be provided with connections 8, which are enlarged portions of headers 5, for receiving and sending fluid. The connections 8 are optional inasmuch as fluid transfer to and from the headers 5 can be accomplished within the width W of the headers 5. Laterals 6 may have the same width as the headers 5 or have a different width either smaller or larger. It is preferred that the laterals 6 have smaller widths than the headers 5.

Embedment of microcomponents 2 or groove sets 4 may be accomplished by any microchannel forming process, but is preferably done with micromachining or photolithography. A photolithographic process is most preferred because the cost of making groove sets 4 is substantially independent of the number of groove sets 4. Microchannel forming processes generally etch a surface so that resulting channels are unconfined on the etched side. Channels are closed by bonding a second laminate to the etched surface. The plurality of solid material lands 10 defining the laterals 6 function as heat transfer fins supporting the high heat flux observed. Each land 10 may be laterally closed as shown in FIG. 2a or laterally open as shown in FIG. 1a to permit cross flow communication. The lands 10 may be of any cross section including but not limited to rectangular, rhomboid, and ellipsoid cross sections. Laterally open lands increase flow area thereby reducing the possibility of clogging and reducing the effect of a clog should it occur. In microcomponents with laterally open lands, the definition of a lateral is less distinct especially if the lands are offset or randomly spaced. Nevertheless, the spaces between the open lands are flow paths.

Although the microcomponents 3 are shown without a top cover, it is preferred that the top be closed with a cover to constrain the flow of fluid to remain within the flow paths and in intimate contact with the lands 10. The cover may be a plain laminate having no microcomponents, for example an insulating laminate, or it may be another microcomponent laminate.

SYSTEMS

A single microcomponent or a set of like microcomponents is capable of performing at least one unit operation. A unit operation is defined as an operation that changes the state of a working fluid including but not limited to condensation, evaporation, compression, pumping, heat exchanging, or expansion. A collection of unit operations is a system. An example of a single microcomponent performing more than one unit operation is a microcompressor in a thermally conductive material performing both compression and heat transfer simultaneously. Of course macrocompressors conduct heat as a result of compressing a gas, but that heat is small compared to the process heat, for example heat removed from a refrigerated space. The distinct advantage of a microcomponent is that the heat transferred simultaneous with the compression is indeed process heat thereby providing a substantially constant temperature compression (approaching an ideal isothermal compression) which results in the most efficient energy transfer/conversion.

In general, a system has a first laminate having a first plurality of microcomponents for performing at least one unit operation; attached to a second laminate having a second plurality of microcomponents for performing at least one additional unit operation;

wherein the unit operation is combined with the additional unit operation and produces a system operation.

Alternatively, instead of having separate unit operations on separate laminates, separate unit operations may be placed on a single laminate having a first portion and at least a second portion. The first portion has first microcomponents for performing a unit operation and the second and subsequent portion(s) have second and subsequent microcomponents for performing another and subsequent unit operation(s). The unit operation is combined with the additional and/or subsequent unit operation(s) and produces a system operation.

Microcomponents performing one unit operation can be combined in several ways with microcomponents performing another unit operation. For example, several microscale pumps in parallel may feed a single heat exchanger, or one microscale pump may feed several heat exchangers in parallel. Similar variations with like microcomponents in series or a combination of series and parallel arrangements may be used advantageously in particular applications.

Laminates or laminate portions are combineable into a wide variety of systems including but not limited to heat pumps, heat engines, heat pipes, thermal sources, and chemical plants, for example chemical converters and chemical separators.

HEAT PUMP

A heat pump of microscale components has the same basic unit operations as a macroscale heat pump. For a vapor compression heat pump the basic unit operations are evaporation, compression, condensation, and expansion. However, the microscale components performing each unit operation are so numerous as to provide the same level of macroscale heating or cooling in terms of thermal kilowatts or megawatts as the macroscale counterpart.

Figure 3A:
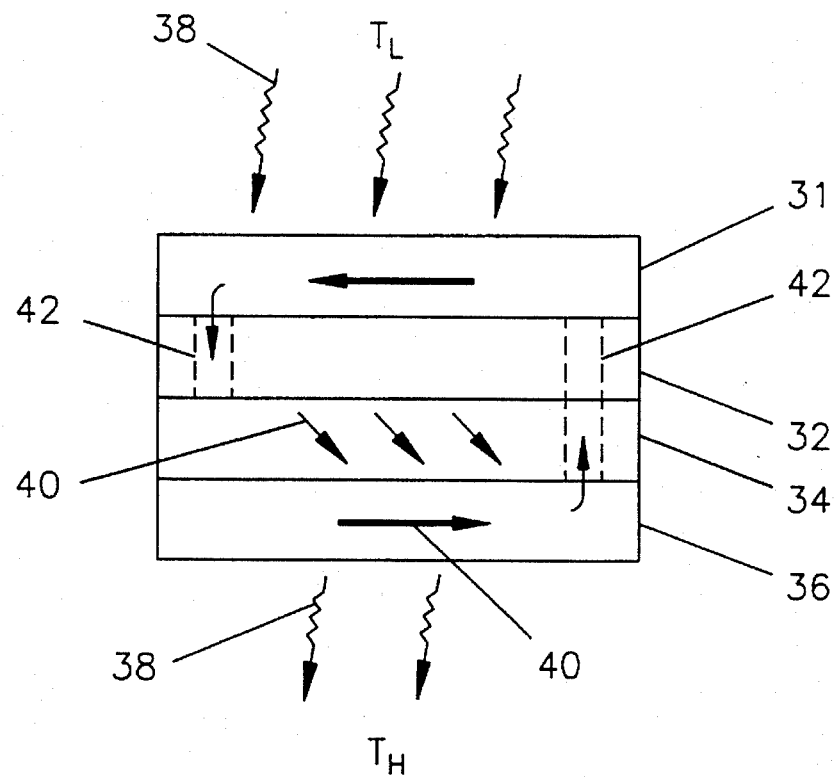
FIG. 3a is a heat pump made of microscale laminates.

A heat pump of microscale components is shown in FIG. 3a, having a microscale evaporator laminate 31, insulation laminate 32, microscale compressor laminate 34, and microscale condenser laminate 36. The microscale evaporator laminate 31 and condenser laminate 36 are laminates having groove sets 4 wherein each groove set 4 is a microcomponent. The microscale compressor microcomponent can be a solid piston linear alternator, a piezoelectric diaphragm as described by Smits JG, 1990, "A Piezoelectric micropump With Three Valves Working Peristaltically", *Sensors and Actuators* 15, 153–67, or other micro-mechanical actuator capable of compressing a gas. Expansion valves or orifices may be etched in the compressor laminate 34, or a separate laminate containing expansion valves may be inserted between the compressor laminate 34 and the insulation laminate 32. The wavy stem arrows 38 outside the laminates indicate the direction of heat transfer from a low temperature $T_L$ to a high temperature $T_H$. The solid stem arrows 40 within the laminates indicate the direction of flow of working fluid. The hidden (dashed or broken) line conduits 42 indicate no fluid contact within that laminate. The conduits 42 may be few as shown or a plurality.

Figure 3B:
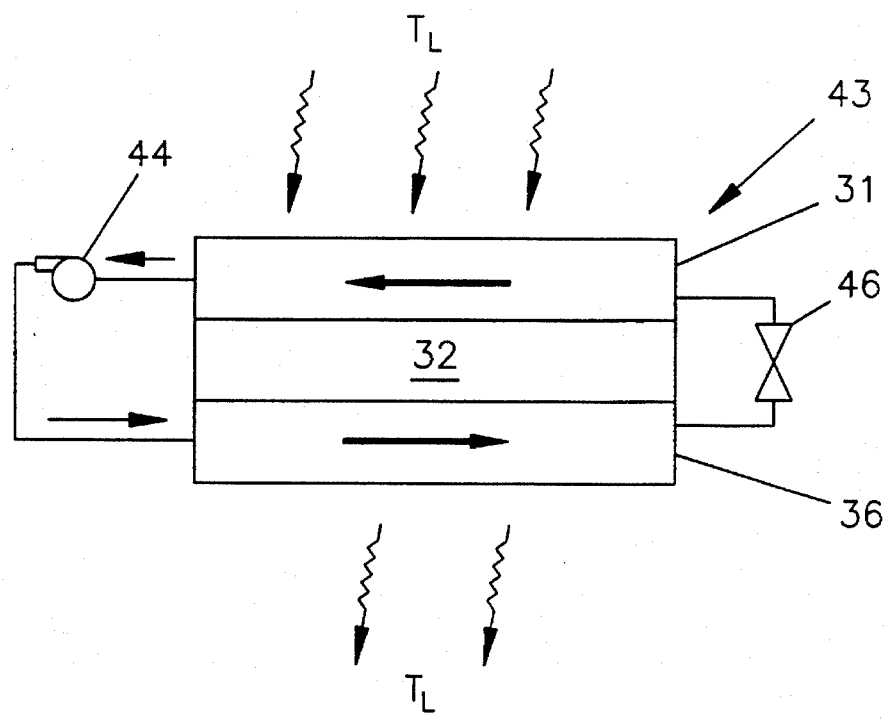
FIG. 3b is a heat pump made of a combination of microscale laminates and macroscale components.

In FIG. 3b, an alternative heat pump embodiment is shown. In this embodiment, the evaporator laminate 31 is placed on the insulation laminate 32 with the condenser laminate 36 on the opposite side of the insulation laminate thereby forming a microcomponent thermal assembly 43. A macroscale compressor 44 and a macroscale expansion valve 46 are mounted externally to the microscale components. It may be noted that in this embodiment, no passages or conduits 42 are needed through the insulation 32.

EXAMPLE 1

Figure 4:
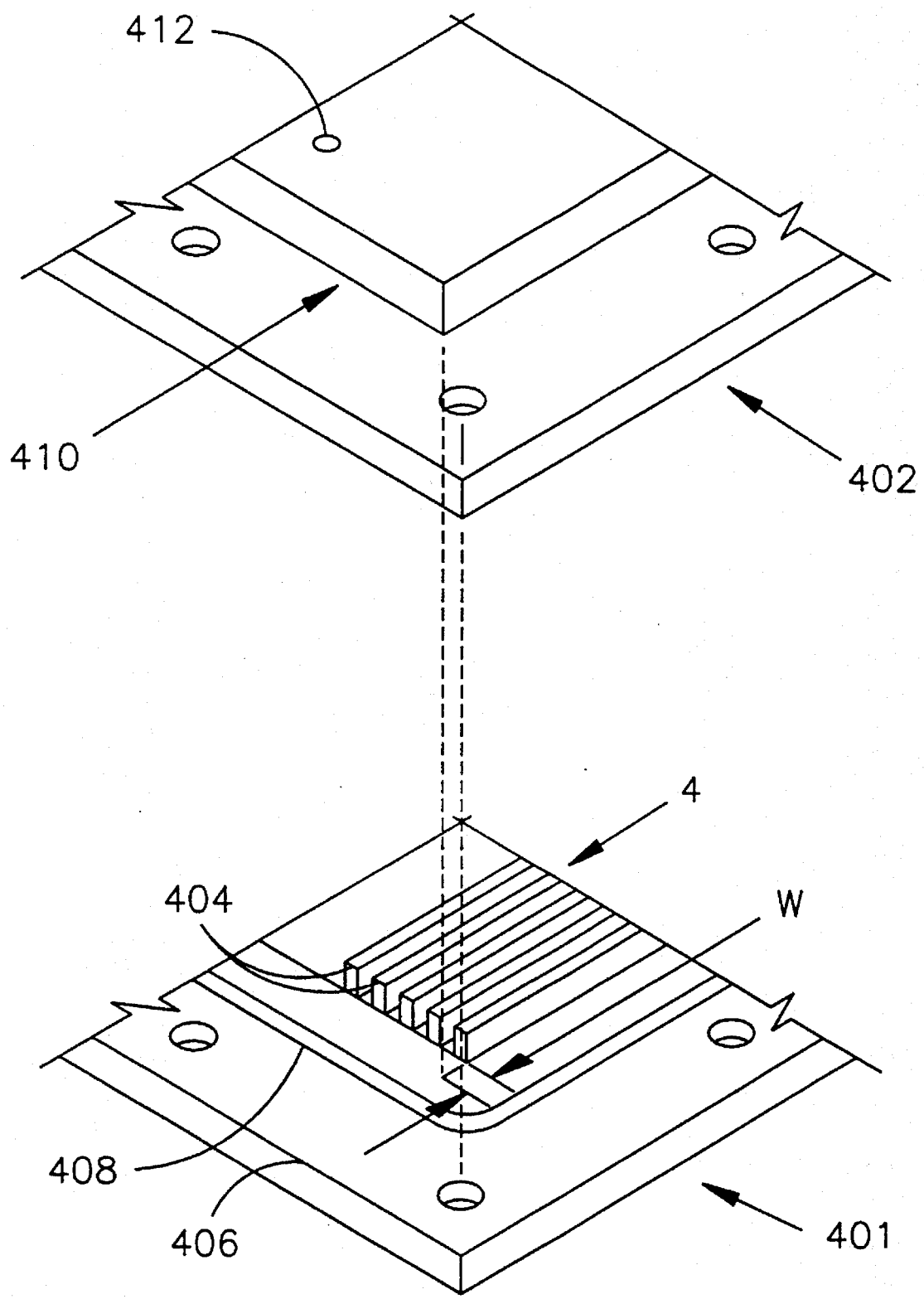
FIG. 4 is an exploded view of a test assembly.

An experiment was conducted to demonstrate operation of microscale condensers and evaporators. A test assembly, shown in FIG. 4, was made having a groove set piece 401 and a manifold 402. Both the groove set piece 401 and the manifold 402 were made from copper. The portion of the groove set piece 401 containing the groove set 4 was about 2.3 cm×2 cm×1 mm and the groove walls 404 extended like fins above a base 406. The groove set 4 contained 48 laterals between pairs of groove walls 404. Each lateral was about 260 microns wide and about 1 mm deep. An o-ring groove 408 contained an o-ring (not shown) for sealing between the groove set piece 401 and the manifold 402.

The manifold 402 had a raised roof 410 of stainless steel. The raised roof 410 fit over the groove set 4 leaving little or no space between the top of the groove walls 404 and the undersurface of the raised roof 404. If there was any space at all, it was within a tenth of a millimeter and most likely within 0.01 millimeter. The raised roof 410 is oversized in the direction parallel to the groove walls 404 thereby forming headers on either end of the groove set 4, the headers having a width W. Fitting connection holes 412 were provided in the raised roof 410 for fluid flow through the groove set 4.

The test assembly was operated as a condenser with refrigerant R-124 as the working fluid. Steady state conditions were defined at a pressure of approximately 3 atm with the inlet receiving superheated R-124 at a temperature of about 20° C. and outlet exhausting subcooled liquid R-124. The condenser was placed in an environment of a water/ice bath at a temperature of 0° C. Refrigerant flow rate varied between 0.150 g/s and 0.205 g/s. The change in enthalpy of the incoming superheated R-124 and the exiting condensed liquid R-124 was 155 joules/g which demonstrated that the test assembly achieved a heat transfer rate of from about 6 to about 8 Watts/cm$^2$ for the working area of the heat exchanger.

HEAT PUMP EMBODIMENTS

The previous description and example of microscale components for a heat pump were centered around a vapor compression cycle. Those skilled in the art of heat pumps would know that other thermodynamic cycles, in addition to vapor compression, are used for heat pumps. For example, Reverse Brayton, Stirling Cycle, and Absorption Cycle have been used.

Figure 5A:
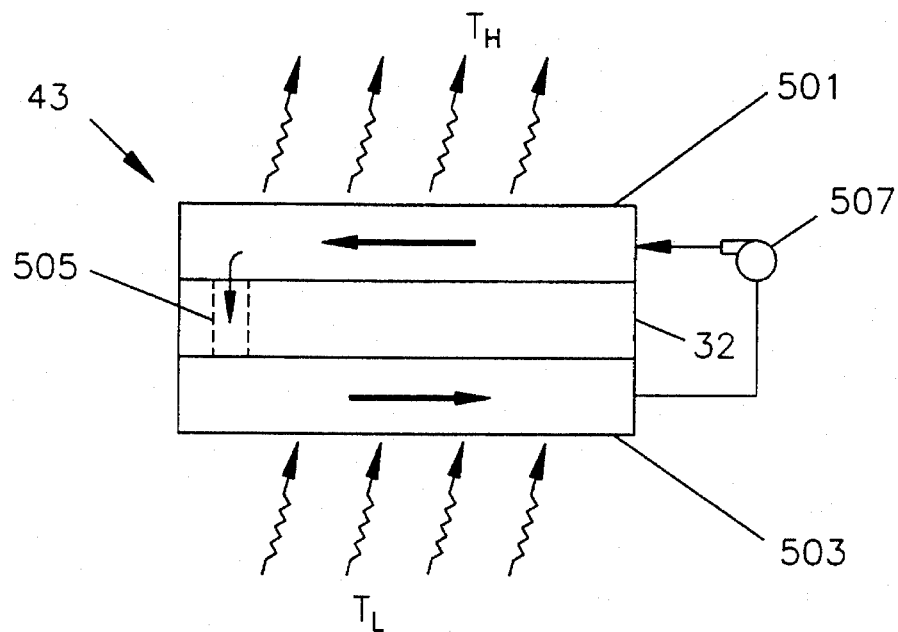
FIG. 5a is a reverse Brayton Cycle heat pump made of a combination of micro and macro scale components.
Figure 5B:
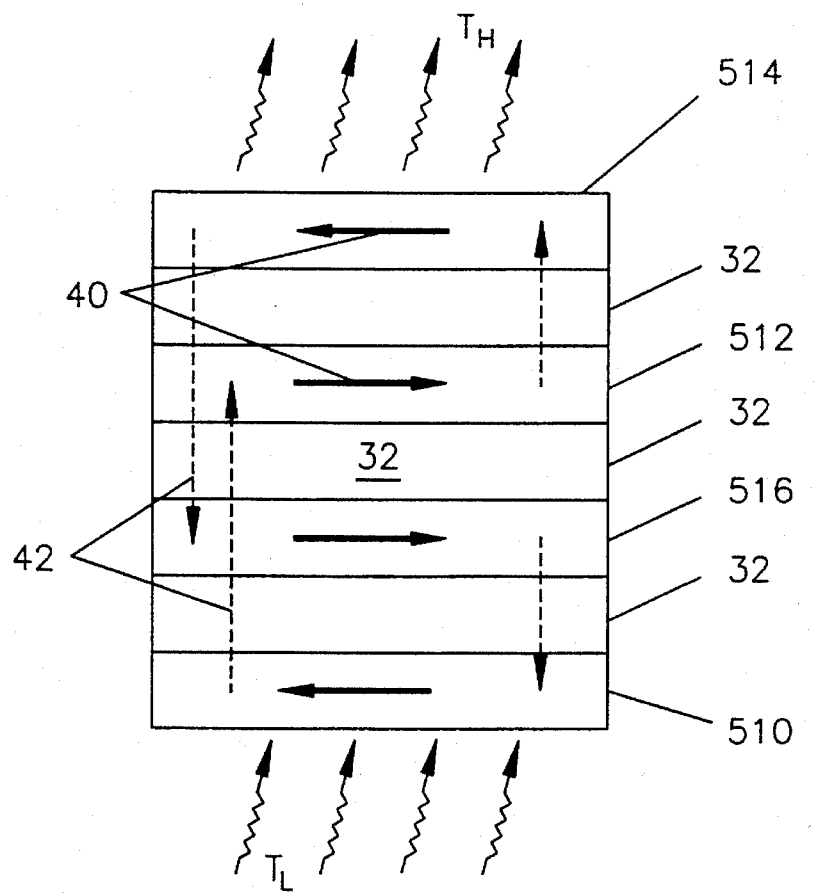
FIG. 5b is a reverse Brayton Cycle heat pump made of microscale components.

FIG. 5a shows a Reverse Brayton heat pump combining microchannel heat exchangers with a macroscale compressor, and FIG. 5b shows a Reverse Brayton heat pump using no macroscale components. In FIG. 5a, the microcomponent thermal assembly 43 is a microchannel heat exchanger rejector 501 having groove sets 4 placed on an insulating laminate 32 with a microchannel heat exchanger receiver 503 placed on the side of the insulating laminate 32 opposite the rejector 501. Expansion valve(s) 505 permit flow from the rejector 501 to the receiver 503. A compressor 507 moves the working fluid through the system.

In FIG. 5b, all unit operations are performed by microcomponents thereby permitting operation approaching an ideal cycle. In FIG. 5b, the receiver 510 is a laminate having microgenerators. In addition, the receiver laminate 510 is made of a thermally conductive material. Because the receiver laminate 501 has microgenerators in combination with a thermally conductive material, the receiver laminate 501 is capable of performing two unit operations simultaneously, namely production of work and receipt of heat which more nearly approaches the ideal isothermal generation or extraction of work. Working fluid leaves the receiver laminate 510 and flows into an isentropic compressor laminate 512, and thence into a rejector laminate 514 having microcompressors in a thermally conductive material for performing simultaneous compression and heat rejection. The working fluid then flows to a generator laminate 516 for isentropic work extraction then back to the receiver laminate 510. Insulation layers 32 are placed between the receiver laminate 510 and the generator laminate 516, between the generator laminate 516 and the compressor laminate 512, and between the compressor laminate 512 and the rejector laminate 514. The broken line conduits 42 indicate fluid passages through various laminates and layers and the solid stem arrows 40 indicate flow of working fluid within a laminate performing at least one unit operation.

It will be apparent to those skilled in the art of Reverse Brayton heat pumps that the combined receiver and rejector laminates 510, 514 can be made of separate compressor and generator laminates and separate heat exchange laminates. However that is less preferred because of the departure from the ideal Reverse Brayton cycle conditions.

HEAT ENGINES

Thermodynamically a heat engine is the reverse of a heat pump. However, practically they are quite different. For example, a heat engine does not use an expansion valve and extracts work from the working fluid. The working fluid may be gas or liquid, but the macroscale heat engine is very different from a macroscale heat pump.

There are numerous thermodynamic cycles upon which even more numerous heat engine designs are based, including but not limited to Rankine Cycle, Brayton Cycle, Stirling Cycle, Otto Cycle, Diesel Cycle, Kalina Cycle, and the Ericcson Cycle. In addition there are combinations or combined cycles and various energy conservation measures. In the Rankine Cycle, for example, reheat, superheat and feedwater preheating have been used alone or in combination in various heat engine applications. All of these cycles are distinct because of the type of working fluid, internal versus external combustion of fuel, and other characteristics well known to skilled practitioners. Nevertheless, all of these thermodynamic cycles and improvements thereto are the result of attempts to approach the performance of the ideal Carnot Cycle.

Use of microscale laminates, especially condensers and evaporators, have the potential of improving the efficiency of these cycles because of their high specific heat transfer rates. Moreover, use of microscale generators, for example electromagnetic actuators driven in reverse, have the possibility of providing completely microscale based heat engine with efficiencies in excess of any other cycle.

Although there are numerous heat engine cycles as mentioned above, it is believed that the following specific descriptions are enabling not only for the specific cycles discussed, but are also enabling for other cycles as well to one skilled in the art of heat engine cycles.

Figure 6A:
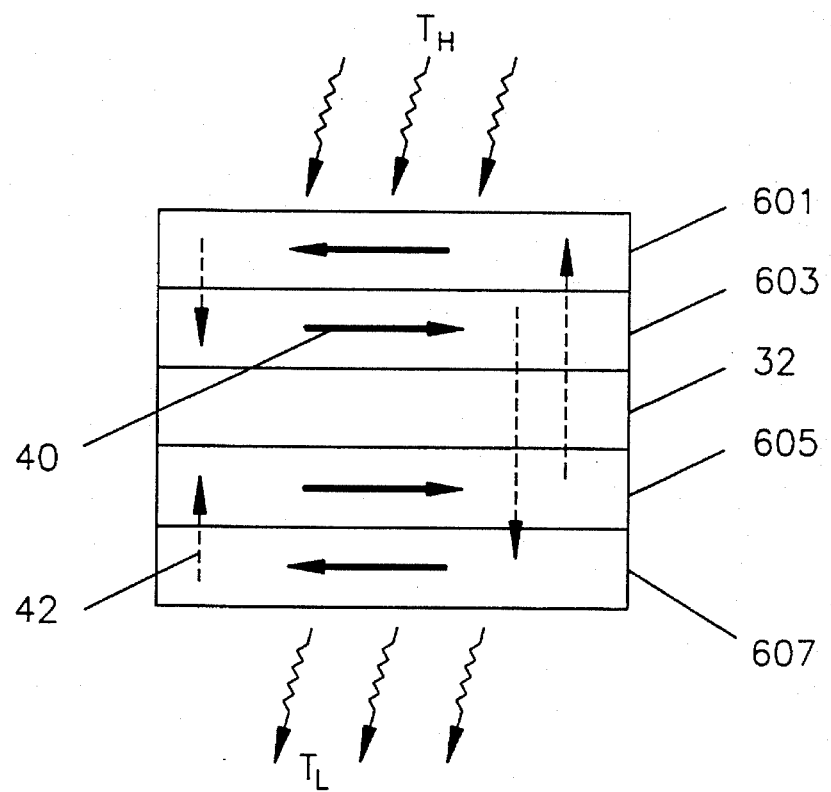
FIG. 6a is a Rankine Cycle heat engine made of microscale components.

FIG. 6a shows a Rankine Cycle heat engine having only microcomponents. An evaporator laminate 601 is placed on a generator laminate 603 on one side of an insulating laminate 32. On the opposite side of the insulating layer 32 is a pump laminate 605 and a condenser laminate 607.

Figure 6B:
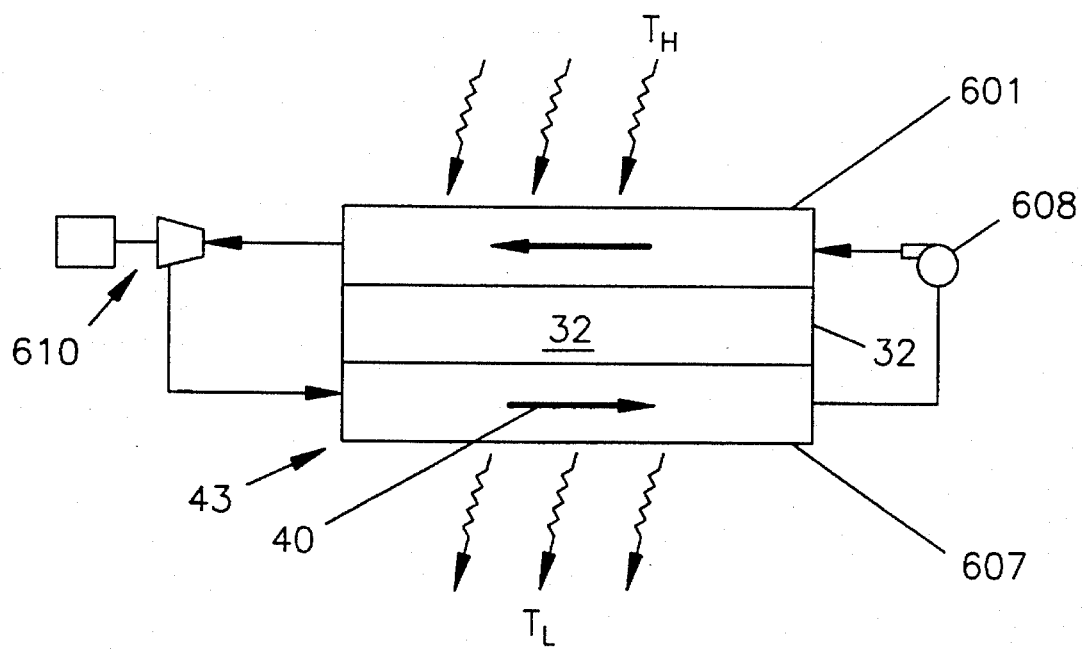
FIG. 6b is a Rankine Cycle heat engine made of a combination of micro and macro scale components.

FIG. 6b shows a Rankine Cycle heat engine having a combination of microcomponents and macrocomponents. The microcomponent thermal assembly 43 is an evaporator laminate 601 placed on one side of an insulating laminate 32 with a condenser laminate 607 on the opposite side of the insulating laminate 32. A pump 608 circulates working fluid from the condenser laminate 607 to the evaporator laminate 601, and a turbine/generator set 610 extracts work from the working fluid and creates electricity.

Figure 7A:
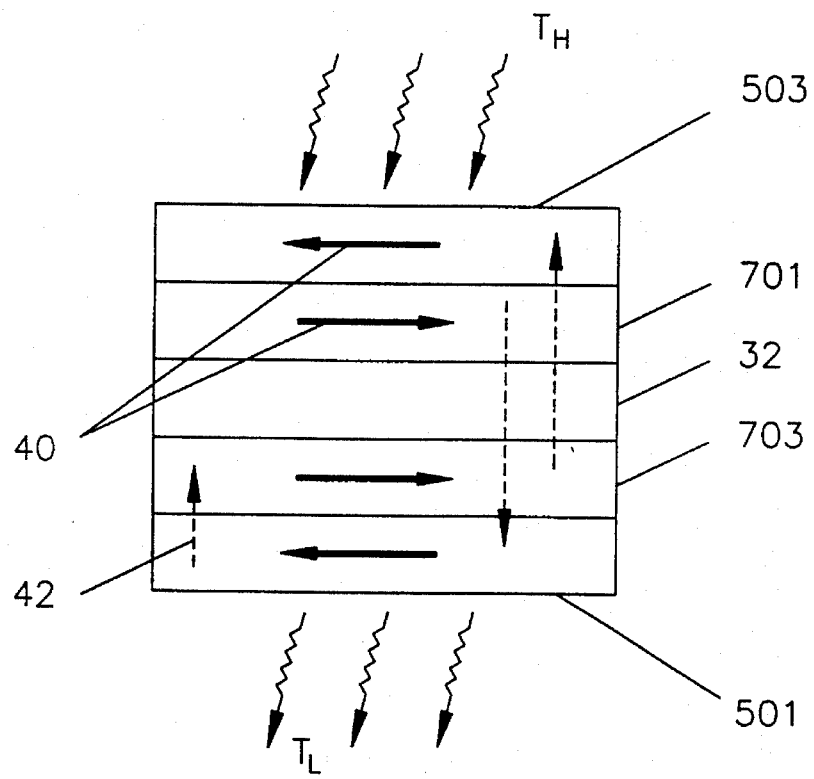
FIG. 7a is a Brayton Cycle heat engine made of microscale components.

FIG. 7a shows a Brayton Cycle heat engine of microcomponents. The two heat exchangers, rejector 501 and receiver 503 may be the same as for the Reverse Brayton cycle previously described. The generator 701 may be similar to the Rankine Cycle generator 603 but with necessary modifications to accommodate a different working fluid. Likewise, the compressor 703 is made compatible with the Brayton Cycle working fluid, usually a gas, for example air.

Figure 7B:
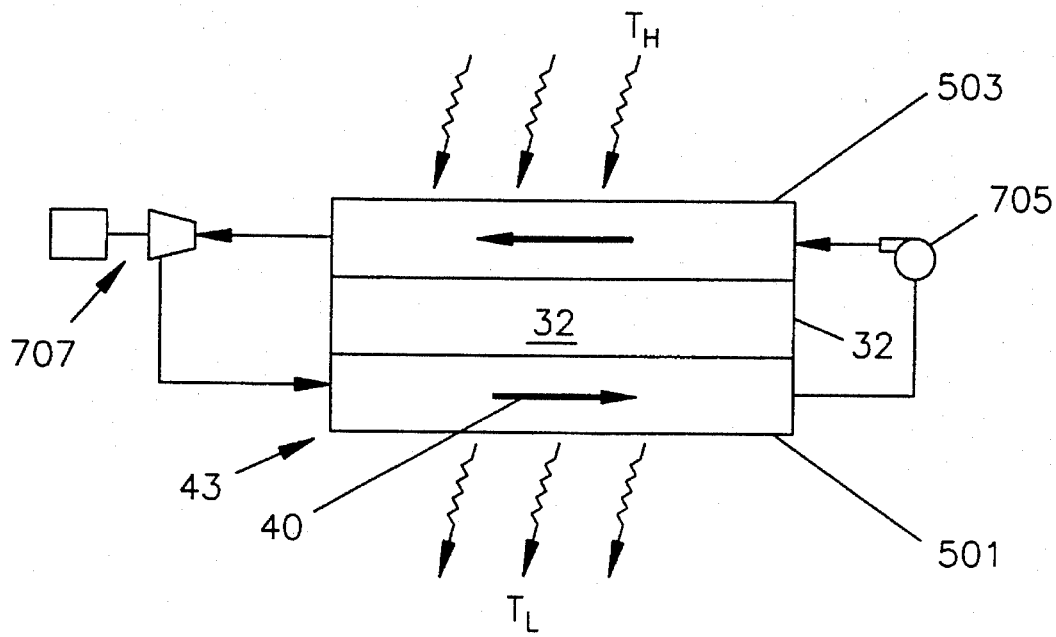
FIG. 7b is a Brayton Cycle heat engine made of a combination of micro and macro scale components.

FIG. 7b shows a Brayton Cycle heat engine having a combination of micro and macro components. The turbine generator set 707 may be similar to the Rankine Cycle turbine generator set 610, but would be specific for handling air or other non-condensible gas rather than steam. Likewise, the compressor 705 and microcomponent thermal assembly 43 would be designed to handle air or other non-condensible gas as the working fluid.

Figure 7C:
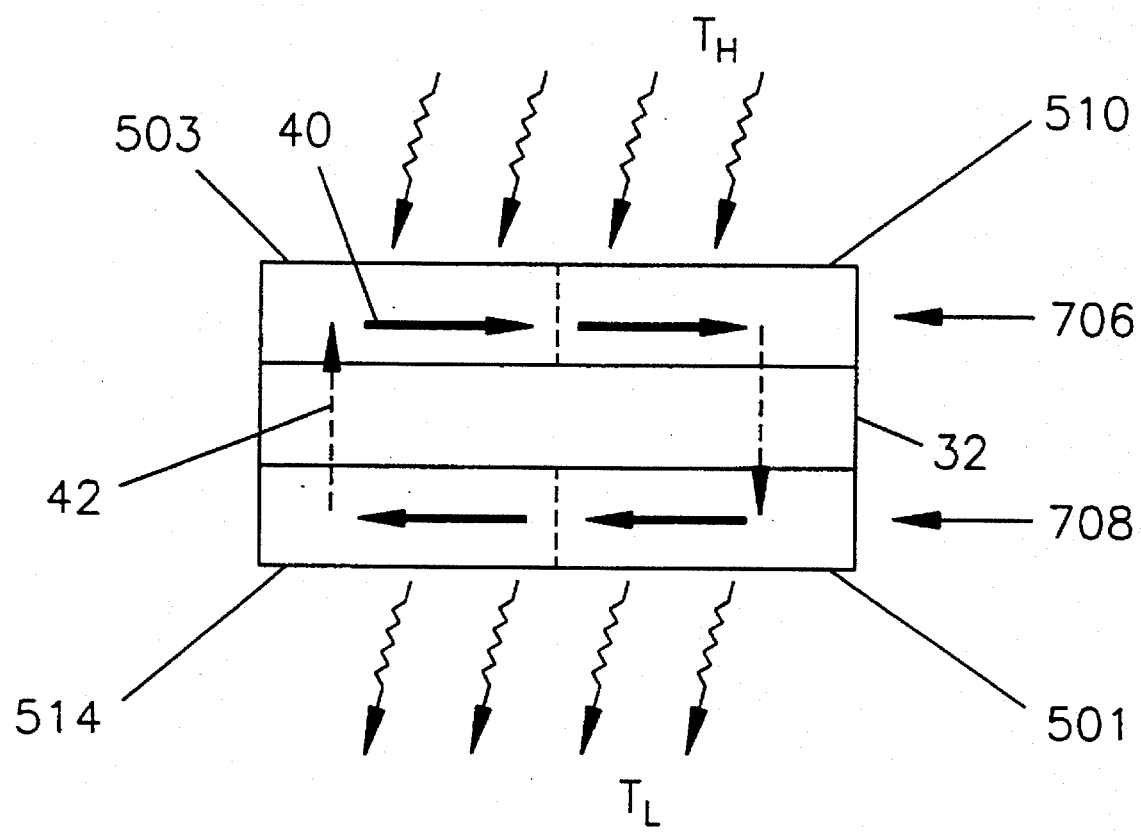
FIG. 7c is an Ericsson Cycle heat engine made of microcomponents.

FIG. 7c shows yet another microcomponent version that approaches an ideal Brayton Cycle, also referred to as the Ericsson Cycle. This embodiment exemplifies a laminate having two unit operations on separate portions of the laminate. Specifically, the receiver laminate 706 has a heat exchanger receiver portion 503 and an isothermal generator portion 510, while the rejector laminate 708 has a heat exchanger rejector portion 501 and an isothermal compressor portion 514.

CLOSURE

The fundamental structures and laminates are assembleable in numerous combinations of micro and macro components and corresponding unit operations, and permutations of microcomponents beyond those shown in the figures and discussed specifically herein. For example the two shown in FIGS. 6a and 6b for Rankine Cycle heat engine operation, are exemplary but not exhaustive.

While preferred embodiments of the present invention have been shown and described, it will be apparent to those skilled in the art that many changes and modifications may be made without departing from the invention in its broader aspects. The skilled person would be able to apply preheating, intercooling, re-heating, combined cycles and other variations as has been done in macro systems. The appended claims are therefore intended to cover all such changes and modifications as fall within the true spirit and scope of the invention.

We claim:

1. A microcomponent sheet architecture, comprising:
    (a) a first laminate having a first plurality of microcomponents; attached to
    (b) a second laminate having a second plurality of microcomponents;
    (c) wherein said first laminate rejects heat and said second laminate receives heat;
        said first and second laminates attached to opposite sides of an insulating laminate forming a microcomponent thermal assembly.

2. The microcomponent sheet architecture as recited in claim 1, wherein said fluid is condensible and condenses in said first laminate and evaporates in said second laminate.

3. The microcomponent sheet architecture as recited in claim 1, further comprising:
    (a) a compressor between the second laminate and the first laminate; and
    (b) an expansion valve between the first laminate and the second laminate, said expansion valve opposite the compressor;
    (c) thereby providing a heat pump.

4. The microcomponent sheet architecture as recited in claim 3, wherein said compressor is a macroscale compressor.

5. The microcomponent sheet architecture as recited in claim 3, wherein said expansion valve is a macroscale expansion valve.

6. The microcomponent sheet architecture as recited in claim 1, further comprising:
   (a) a pump or compressor between the first laminate and the second laminate; and
   (b) a work extractor opposite the pump or compressor and between the second laminate and the first laminate;
   (c) thereby providing a heat engine.

7. The microcomponent sheet architecture as recited in claim 6, wherein said compressor or pump is a macroscale compressor or pump.

8. The microcomponent sheet architecture as recited in claim 6, wherein said work extractor is a macroscale work extractor.

9. A microcomponent sheet architecture, comprising;
   (a) a first laminate having a first portion and a second portion, the first portion having a first plurality of mocrocomponents wherein each of said first plurality of microcomponents further comprises:
      (a) a plurality of lands and flow paths; and
      (b) a fluid flowing through said flow paths; thereby
      (c) rejecting or receiving heat; the second portion having a second plurality of microcomponnts wherein each of said second plurality of mocrocomponents further comprises:
      (a) a plurality of active microcomponents; and
      (b) the fluid flowed through said flow paths by said active microcomponents; thereby
      (c) receiving or rejecting heat and extracting work from or compressing said fluid.

10. The microcomponent sheet architecture as recited in claim 9, wherein said first laminate, first portion receives heat and said first laminate, second portion both extracts work from the fluid and receives heat.

11. The microcomponent sheet architecture as recited in claim 10, wherein a second laminate having the first and second portions of the first laminate wherein said second laminate, first portion rejects heat and said second laminate, second portion both compresses the fluid and rejects heat thereby approaching an ideal Brayton Cycle machine.

12. A microcomponent thermal assembly, comprising:
   (a) a first laminate having at least one microcomponent with a plurality of lands and flow paths; attached to
   (b) a first side of an insulating laminate; and
   (c) a second laminate having at least one microcomponent with a plurality of lands and flow paths, said second laminate attached to a second side of the insulating laminate;
   (d) wherein one or the other of the first and second laminates is used as a heat rejector and the remaining laminate is used as a heat receiver.

13. The microcomponent thermal assembly as recited in claim 12, wherein said heat rejector is a condenser and said heat receiver is an evaporator.

14. A microcomponent sheet architecture, comprising:
   (a) a first laminate having a first plurality of microcomponents for performing at least one unit operation; attached to
   (b) a unit requiring heat rejection,
   (c) wherein each of said first plurality of microcomponents further comprises;
      (1) a plurality of lands and flow paths; and
      (2) an evaporable fluid flowing through said flow paths; thereby
   (d) rejecting or receiving heat.

15. The microcomponent sheet architecture as recited in claim 14, further comprising:
   components resulting in a heat pump, heat engine, or heat pipe.

* * * * *

UNITED STATES PATENT AND TRADEMARK OFFICE
CERTIFICATE OF CORRECTION

PATENT NO. : 5,611,214
DATED : 03/18/97
INVENTOR(S) : Wegeng et al.

It is certified that error appears in the above-identified patent and that said Letters Patent is hereby corrected as shown below:

In column 6, line 63, please replace the number "501" with --510--.

In column 6, line 65, please replace the number "501" with --510--.

Signed and Sealed this

Twenty-sixth Day of August, 1997

*Attest:*

BRUCE LEHMAN

*Attesting Officer*  Commissioner of Patents and Trademarks

(12) EX PARTE REEXAMINATION CERTIFICATE (9046th)
United States Patent
Wegeng et al.

(10) Number: US 5,611,214 C1
(45) Certificate Issued: Jun. 5, 2012

(54) MICROCOMPONENT SHEET ARCHITECTURE

(75) Inventors: Robert S. Wegeng, Richland, WA (US); M. Kevin Drost, Richland, WA (US); Carolyn E. McDonald, Richland, WA (US)

(73) Assignee: The United States of America as represented by the Department of Energy, Washington, DC (US)

Reexamination Request:
No. 90/011,090, Aug. 10, 2010

Reexamination Certificate for:
Patent No.: 5,611,214
Issued: Mar. 18, 1997
Appl. No.: 08/282,663
Filed: Jul. 29, 1994

Certificate of Correction issued Aug. 26, 1997.

(51) Int. Cl.
*F25B 1/00* (2006.01)
*F28F 7/00* (2006.01)

(52) U.S. Cl. ........................... 62/498; 62/51.1; 165/185; 361/700

(58) Field of Classification Search ........................ None
See application file for complete search history.

(56) References Cited

To view the complete listing of prior art documents cited during the proceeding for Reexamination Control Number 90/011,090, please refer to the USPTO's public Patent Application Information Retrieval (PAIR) system under the Display References tab.

*Primary Examiner* — Jeffrey R. Jastrzab

(57) ABSTRACT

The invention is a microcomponent sheet architecture wherein macroscale unit processes are performed by microscale components. The sheet architecture may be a single laminate with a plurality of separate microcomponent sections or the sheet architecture may be a plurality of laminates with one or more microcomponent sections on each laminate. Each microcomponent or plurality of like microcomponents perform at least one unit operation. A first laminate having a plurality of like first microcomponents is combined with at least a second laminate having a plurality of like second microcomponents thereby combining at least two unit operations to achieve a system operation.

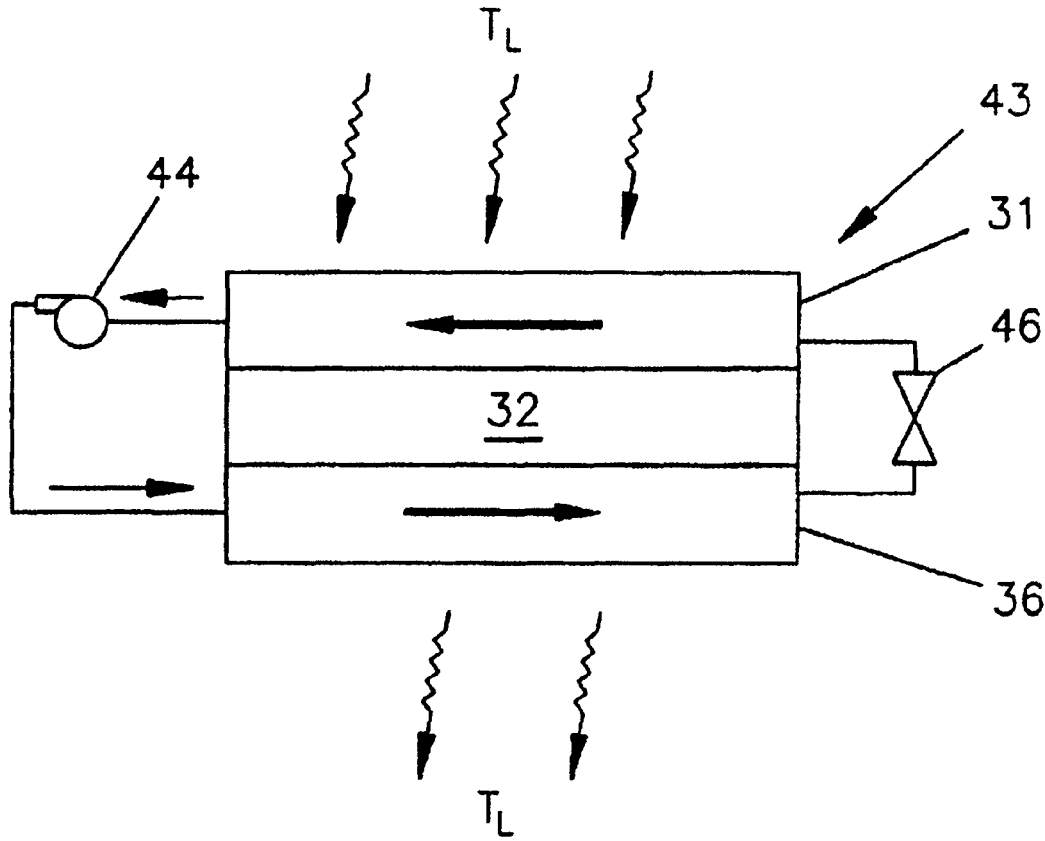

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claim 1 is confirmed.

Claims 2-15 were not reexamined.

* * * * *